US011677889B2

(12) United States Patent
Narai

(10) Patent No.: US 11,677,889 B2
(45) Date of Patent: Jun. 13, 2023

(54) APPARATUS AND IMAGE FORMING APPARATUS

(71) Applicant: Satoshi Narai, Kanagawa (JP)

(72) Inventor: Satoshi Narai, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 17/154,095

(22) Filed: Jan. 21, 2021

(65) Prior Publication Data
US 2021/0234984 A1 Jul. 29, 2021

(30) Foreign Application Priority Data

Jan. 24, 2020 (JP) .............................. JP2020-010082

(51) Int. Cl.
*H04N 1/00* (2006.01)
*H05K 7/20* (2006.01)
(52) U.S. Cl.
CPC ..... *H04N 1/00981* (2013.01); *H05K 7/20145* (2013.01); *H05K 7/20172* (2013.01)
(58) Field of Classification Search
CPC ........... H04N 1/00981; H05K 7/20145; H05K 7/20172
See application file for complete search history.

(56) References Cited

U.S. PATENT DOCUMENTS

| | | | | |
|---|---|---|---|---|
| 7,558,060 B2 * | 7/2009 | Kiyosumi | ............. | B41J 2/1408 399/92 |
| 8,040,673 B2 * | 10/2011 | Krietzman | ......... | H05K 7/20009 165/104.19 |
| 9,377,756 B2 * | 6/2016 | Takenaga | ............. | G03G 21/206 |
| 9,526,191 B2 * | 12/2016 | Straznicky | ......... | H05K 7/20563 |
| 9,763,364 B1 * | 9/2017 | Amoah-Kusi | .......... | F28F 13/08 |
| 10,410,464 B2 * | 9/2019 | Wasinger | ........... | B01D 46/0002 |
| 11,547,020 B2 * | 1/2023 | Lewis, II | ........... | H05K 7/20745 |
| 2010/0061059 A1 * | 3/2010 | Krietzman | ......... | H05K 7/20745 361/690 |
| 2011/0285078 A1 | 11/2011 | Andoh et al. | | |

(Continued)

FOREIGN PATENT DOCUMENTS

JP 2008250284 A * 10/2008
JP 2010-145733 7/2010

(Continued)

OTHER PUBLICATIONS

Kasama Minoru, "Image Forming Apparatus, Program, and Electronic Equipment", Mar. 3, 2011, Fuji Xerox Co Ltd, Entire Document (translation of JP 2011043532) (Year: 2011).*

(Continued)

*Primary Examiner* — Stephen S Sul
(74) *Attorney, Agent, or Firm* — Harness, Dickey & Pierce, P.L.C.

(57) ABSTRACT

An apparatus includes a body, an object to be cooled, a unit, a structural frame, and a ventilation duct. The unit is disposed detachably from the body of the apparatus. The structural frame constitutes a part of the body or the unit. The ventilation duct includes a plurality of ducts connected to each other. The ventilation duct is configured to guide air sucked from outside of the body through an intake of the body to an exhaust port to blow the air to the object to be cooled. The structural frame includes a part of at least one of the plurality of ducts.

14 Claims, 7 Drawing Sheets

(56) References Cited

U.S. PATENT DOCUMENTS

| | | | |
|---|---|---|---|
| 2012/0230720 A1* | 9/2012 | Murano | G03G 21/206 399/92 |
| 2014/0147160 A1* | 5/2014 | Konishi | G03G 21/206 399/92 |
| 2016/0128226 A1* | 5/2016 | Stellick | H05K 7/20727 361/679.46 |
| 2017/0003647 A1* | 1/2017 | Ueno | G03G 21/206 |
| 2017/0134598 A1 | 5/2017 | Nagano et al. | |
| 2017/0142265 A1 | 5/2017 | Horikawa et al. | |
| 2019/0068815 A1 | 2/2019 | Andoh et al. | |
| 2020/0130350 A1* | 4/2020 | Hara | B41J 11/00222 |
| 2020/0207121 A1* | 7/2020 | Washio | B41J 11/0022 |

FOREIGN PATENT DOCUMENTS

| | | | | |
|---|---|---|---|---|
| JP | 2010145733 A | * | 7/2010 | |
| JP | 2011043532 A | * | 3/2011 | |
| JP | 2016167496 A | * | 9/2016 | G03B 21/16 |
| JP | 2017-161622 | | 9/2017 | |
| JP | 2017-161623 | | 9/2017 | |

OTHER PUBLICATIONS

Abe Naoyuki, "Electronic Apparatus, Control Method Thereof, and Control Program", Sep. 15, 2016, Canon KK, Entire Document (translation of JP 2016167496) (Year: 2016).*

Terakawa Shogo, "Image Forming Apparatus", Sep. 14, 2017, Ricoh Co Ltd, Entire Document (translation of JP 2017161623)(of record, cited in IDS, including Original Document). (Year: 2017).*

Tanaka Takashi; Shima Nobuhiro; Sato Yuki, "Image Forming Apparatus", Oct. 16, 2008, Ricoh KK, Entire Document (Translation of JP 2008250284). (Year: 2008).*

Yamashita Kazuya; Inui Yoji, "Image Forming Apparatus", Jul. 1, 2010, Kyocera Mita Corp., Entire Document (Translation of JP 2010145733). (Year: 2010).*

* cited by examiner

APPARATUS AND IMAGE FORMING APPARATUS

CROSS-REFERENCE TO RELATED APPLICATION

This patent application is based on and claims priority pursuant to 35 U.S.C. § 119(a) to Japanese Patent Application No. 2020-010082, filed on Jan. 24, 2020, in the Japan Patent Office, the entire disclosure of which is hereby incorporated by reference herein.

BACKGROUND

Technical Field

Embodiments of the present disclosure relate to an apparatus including an object to be cooled therein, and an image forming apparatus including the apparatus such as a copier, a printer, a facsimile, or a multifunction peripheral that includes the functionality of, for example, the printer and the facsimile.

Description of the Related Art

Technologies are widely known in the art to cool an object to be cooled such as a powder conveyance unit disposed inside an apparatus such as an image forming apparatus.

More specifically, air is taken in from outside of the image forming apparatus to inside of the image forming apparatus by a fan, and the taken-in air flows through a duct and is blown from an exhaust port toward a powder conveyance unit that is an example of the object to be cooled.

SUMMARY

In an aspect of the present disclosure, an apparatus includes a body, an object to be cooled, a unit, a structural frame, and a ventilation duct. The unit is disposed detachably from the body of the apparatus. The structural frame constitutes a part of the body or the unit. The ventilation duct includes a plurality of ducts connected to each other. The ventilation duct is configured to guide air sucked from outside of the body through an intake of the body to an exhaust port to blow the air to the object to be cooled. The structural frame includes a part of at least one of the plurality of ducts.

In another aspect of the present disclosure, an image forming apparatus includes the apparatus and an image forming device.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

Figure 1:
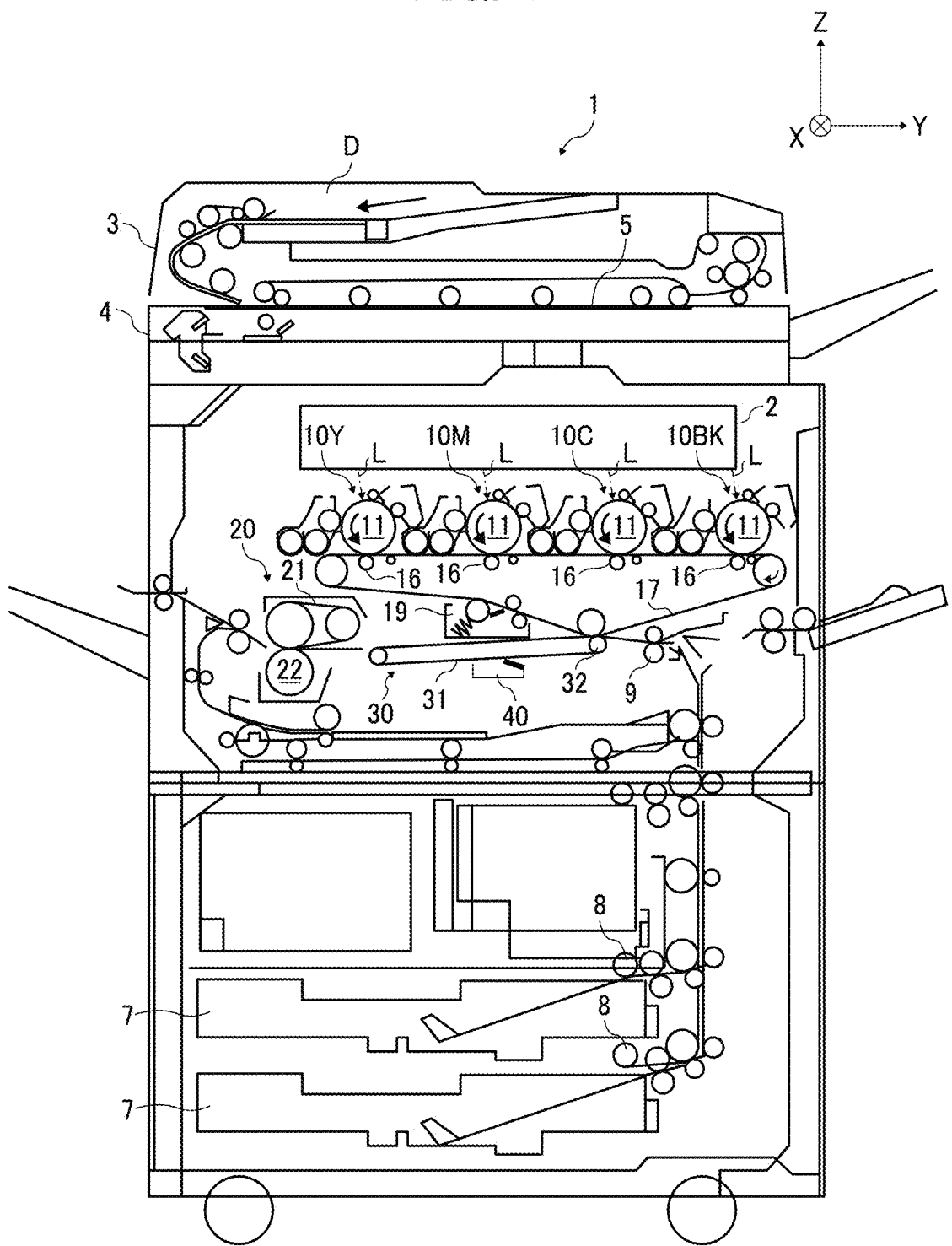
FIG. 1 is a schematic view of a configuration of an image forming apparatus according to an embodiment of the present disclosure.

The accompanying drawings are intended to depict embodiments of the present disclosure and should not be interpreted to limit the scope thereof. The accompanying drawings are not to be considered as drawn to scale unless explicitly noted.

DETAILED DESCRIPTION

In describing embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner and achieve similar results.

Although the embodiments are described with technical limitations with reference to the attached drawings, such description is not intended to limit the scope of the disclosure and all of the components or elements described in the embodiments of this disclosure are not necessarily indispensable.

Referring now to the drawings, embodiments of the present disclosure are described below. In the drawings for explaining the following embodiments, the same reference codes are allocated to elements (members or components) having the same function or shape and redundant descriptions thereof are omitted below.

Embodiments according to the present disclosure are described in detail with reference to drawings. Identical reference numerals are assigned to identical components or equivalents and a description of those components is simplified or omitted.

Firstly, an overall configuration and operation of an image forming apparatus 1 is described below with reference to FIG. 1.

The image forming apparatus 1 is an apparatus including an image forming device that forms an image.

As illustrated in FIG. 1, the image forming apparatus 1 includes a writing device 2 that emits a laser beam based on input image data, a document reader 4 that reads image data of the document D, a document conveyance unit 3 that conveys a document D to the document reader 4, a sheet feeder 7 that accommodates sheets such as sheets of paper, and a registration roller 9 that adjusts conveyance timing of the sheets.

Moreover, the image forming apparatus 1 includes process cartridges 10Y, 10M, 10C, and 10BK, in which toner images of colors (yellow, magenta, cyan, and black) are formed on a plurality of photoconductor drums 11, respectively, a plurality of primary transfer rollers 16 that transfer the toner images formed on the photoconductor drums 11 of the respective process cartridges 10Y, 10M, 10C, and 10BK onto an intermediate transfer belt 17 in a superimposed manner.

Further, the image forming apparatus 1 includes the intermediate transfer belt 17 to which toner images of a plurality of colors are transferred in a superimposed manner, an intermediate transfer belt cleaner 19 that cleans the intermediate transfer belt 17, a fixing device 20 that fixes a toner image (not-yet-fixed image) on a sheet, a secondary transfer belt 31 that transfers the toner image on the intermediate transfer belt 17 onto the sheet, and a secondary transfer-belt cleaner 40 that cleans the second an transfer belt 31.

The four process cartridges 10Y, 10M, 10C, and 10BK (image forming devices) have substantially the same structure except the colors of the toner T used in the image forming process.

The operation of the image forming apparatus 1 (apparatus) during normal color image formation is described below.

The document D is conveyed by conveyance rollers of the document conveyance unit 3 in a direction indicated by an arrow in FIG. 1 from a document table and placed onto an exposure glass 5 of the document reader 4. Then, the document reader 4 optically scans the image data of the document D placed on the exposure glass 5.

The image data of each color (yellow, magenta, cyan, and black) is transmitted to the writing device 2. The writing device 2 emits laser beam L (exposure light) based on the image data of each color toward the surfaces of the photoconductor drums 11 (image bearers) of the respective process cartridges 10Y, 10M, 10C, and 10BK.

On the other hand, the photoconductor drums 11 of the four process cartridges 10Y, 10M, 10C, and 10BK rotate in a predetermined rotation direction (counterclockwise direction in FIG. 1). Firstly, in a charging step, the surface of each of the photoconductor drums 11 is evenly charged at a contact position with a charging roller. As a result, the photoconductor drums 11 are charged at charge potentials Vd (about −700V). Subsequently, the charged surface of each of the photoconductor drums 11 reaches a position in which the surface of each of the photoconductor drums 11 is irradiated with the laser beam L.

In the writing device 2, the laser beams L that represent the respective colors are emitted from four light sources based on an image signal. In an exposure step, the respective laser beams L pass through different optical paths for the different color components of yellow, magenta, cyan, and black.

The laser beam L that represents yellow component is emitted to a surface of a first photoconductor drum 11 (image bearer) from the left side as in FIG. 1. At this time, a polygon mirror rotates at high velocity and scans the corresponding photoconductor drum 11 with the reflected laser beam L of the yellow component in the rotation axis direction, i.e., the main-scanning direction. Thus, an electrostatic latent image that corresponds to the yellow component is formed on the photoconductor drum 11 that has been charged by the corresponding charging roller (exposure potential of about −50 to 100V is formed).

Similarly, the laser beam L that corresponds to magenta component is emitted to a surface of the second photoconductor drum 11 from the left side as in FIG. 1. As a result, an electrostatic latent image that corresponds to magenta component is formed. A surface of the third photoconductor drum 11 from the left side as in FIG. 1 is irradiated with the laser beam L corresponding to cyan component to form an electrostatic latent image of the cyan component. A surface of the fourth photoconductor drum 11 from the left side as in FIG. 1 is irradiated with the laser beam L corresponding to black component to form an electrostatic latent image of the black component.

Thereafter, each of the surfaces of the photoconductor drums 11 on which the electrostatic latent image of the corresponding color is formed reaches a position facing a corresponding developing device. Then, in a developing step, toner of each color is supplied onto the photoconductor drum 11 from the respective developing device, and the electrostatic latent images on the photoconductor drums 11 are developed to form toner images.

After the developing step, each of the surfaces of the photoconductor drums 11 reaches a position of a primary transfer nip facing the intermediate transfer belt 17. At each of the positions facing the intermediate transfer belt 17, a primary transfer roller 16 is disposed so as to contact the inner peripheral surface of the intermediate transfer belt 17. In a primary transfer step, the toner images on the photoconductor drums 11 are sequentially transferred and superimposed onto the intermediate transfer belt 17, at the positions of the primary transfer rollers 16, forming a multicolor toner image on the intermediate transfer belt 17.

After the primary transfer step, each of the surfaces of the photoconductor drums 11 reaches a position facing a corresponding cleaning device. In a cleaning step, untransferred toner that remains on the photoconductor drums 11 is mechanically removed at such positions facing the cleaning devices and the removed untransferred toner is collected in the cleaning devices.

Thereafter, each of the surfaces of the photoconductor drums 11 sequentially passes through the position of a charge remover, and a series of image forming process on the photoconductor drums 11 is completed.

On the other hand, the intermediate transfer belt 17 onto which the toners of yellow, cyan, magenta, and black on the photoconductor drums 11 are transferred and borne in a superimposed manner travels in a clockwise direction as in FIG. 1 and reaches a position of a secondary transfer nip facing the secondary transfer belt device 30 at the secondary transfer roller 32. Then, in a secondary transfer step, the color toner image borne on the intermediate transfer belt 17 is transferred onto the sheet (sheet of paper) at the position of the secondary transfer nip.

The secondary transfer belt device 30 includes, for example, a secondary transfer belt 31 and a secondary transfer-belt cleaner 40. The secondary transfer belt 31 is stretched taut and supported by a plurality of rollers. The secondary transfer-belt cleaner 40 removes attached materials such as an excess toner and paper dust attached to the secondary transfer belt 31. The secondary transfer belt 31 is stretched taut and supported by at least a plurality of rollers. One of the plurality of rollers, i.e., the secondary transfer roller 32, is pressed against the intermediate transfer belt 17 via the secondary transfer belt 31. The secondary transfer belt 31 travels in a counterclockwise direction in FIG. 1 and also has a function of conveying the sheet that has gone through the secondary transfer step toward the fixing device 20.

In the present embodiment, the attached material such as the toner collected by the secondary transfer-belt cleaner 40 is conveyed through a first waste-toner carrier pipe 71 and a second waste-toner carrier pipe 72 (see, for example, FIG. 3), which serve as powder carrier pipes, and is collected to a waste-toner collection container 90 as waste toner.

On the other hand, the surface of the intermediate transfer belt 17 after the secondary transfer step reaches the position of the intermediate transfer belt cleaner 19. The intermediate transfer belt cleaner 19 collects untransferred toner adhering to the intermediate transfer belt 17 to complete a series of transfer process performed on the intermediate transfer belt 17.

In the present embodiment, the sheet conveyed between the intermediate transfer belt 17 and the secondary transfer belt 31 (secondary transfer nip) is conveyed from the sheet feeder 7 via the registration roller 9 and the like.

More specifically, a sheet feeding roller 8 feeds the sheet from the sheet feeder 7 that stores sheets and the sheet is then guided to the registration roller 9 (i.e., timing roller) after passing through conveyance guides. The sheet having reached the registration roller 9 is conveyed toward the secondary transfer nip at a proper timing.

Subsequently, the sheet on which the multicolor image has been transferred is guided to the fixing device 20 by a conveyance belt. In the fixing device 20, the multicolor image (toner) is fixed on the sheet by heat and pressure at a nip between the fixing belt 21 and the pressure roller 22.

Then, the sheet that has gone through the fixing step is ejected as an output image document to the outside of the image forming apparatus 1 by ejection rollers and a series of image forming process (printing operation) is completed.

Figure 2:
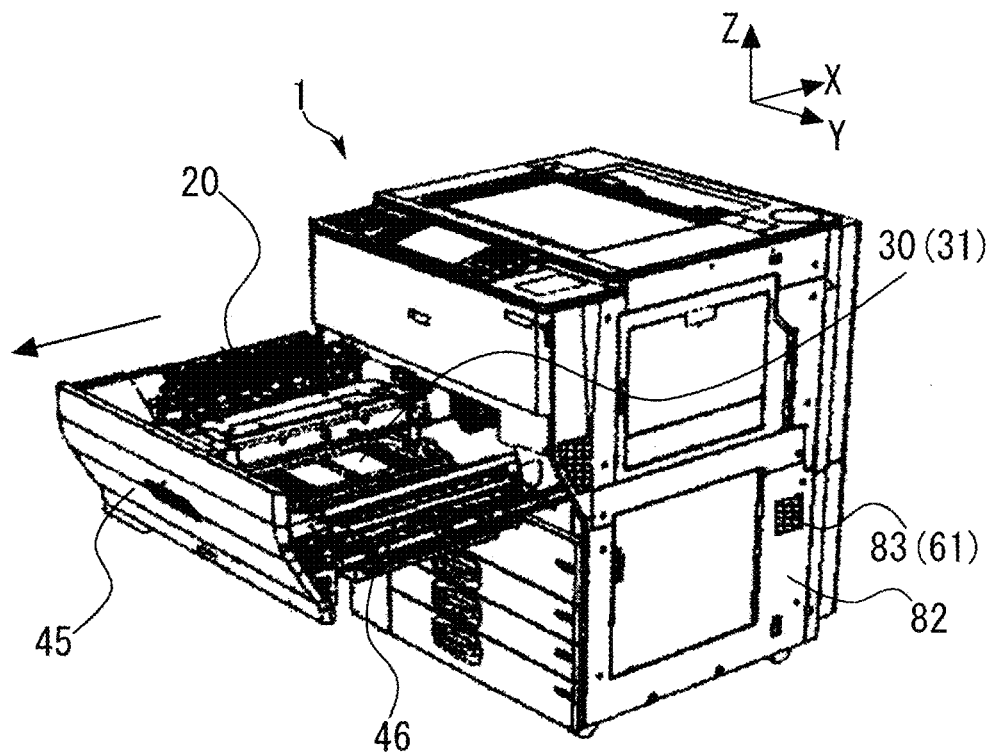
FIG. 2 is a perspective view of an image forming apparatus in a state in which a drawer unit is pulled out, according to an embodiment of the present disclosure.
Figure 3:
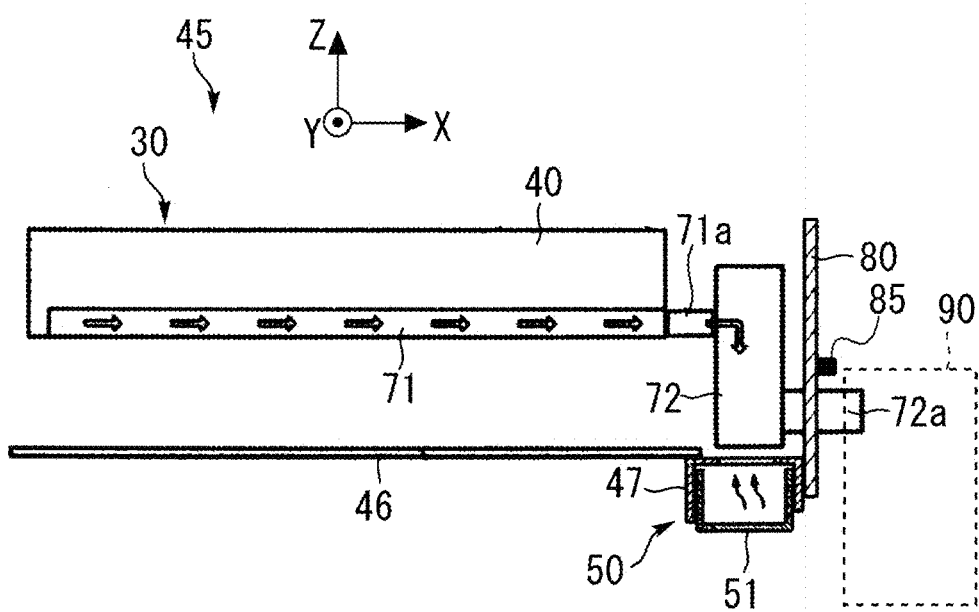
FIG. 3 is a schematic view of a waste-toner conveyance path of an image forming apparatus, according to an embodiment of the present disclosure.
Figure 4:
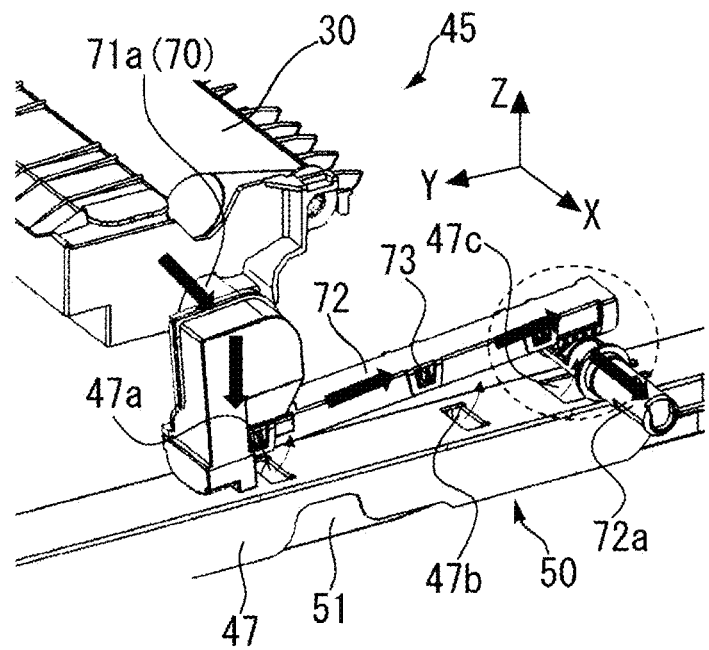
FIG. 4 is a perspective view of a waste-toner conveyance path of an image forming apparatus, according to an embodiment of the present disclosure.

Hereinafter, a configuration and operation of the image forming apparatus 1 as an apparatus according to an embodiment of the present disclosure is described. FIG. 2 is a perspective view of the image forming apparatus 1 in a state in which a drawer unit 45 is pulled out, according to the present embodiment. FIG. 3 is a schematic view of a waste-toner conveyance path of the image forming apparatus 1, according to the present embodiment. FIG. 4 is a perspective view of the waste-toner conveyance path of the image forming apparatus 1, according to the present embodiment.

The image forming apparatus 1 according to the present embodiment is an apparatus that includes the first waste-toner carrier pipe 71 and the second waste-toner carrier pipe 72 (powder carrier pipes) as the objects to be cooled.

With reference to, for example, FIG. 3, as powder carrier pipes, the first waste-toner carrier pipe 71 and the second waste-toner carrier pipe 72 (waste-toner conveyance paths) each include a conveyance screw 73 (see FIG. 4) as a conveyance member. The conveyance screw 73 conveys the waste toner (the attached material such as the toner removed from the secondary transfer belt 31) as powder collected by the secondary transfer-belt cleaner 40 in the secondary transfer belt device 30 toward the waste-toner collection container 90.

More specifically, with reference to FIGS. 2 and 3, the first waste-toner carrier pipe 71 and the second waste-toner carrier pipe 72 constitute the drawer unit 45 together with the secondary transfer belt device 30 and the fixing device 20. The drawer unit 45 is detachably attached to a body of the image forming apparatus 1.

More specifically, the secondary transfer belt device 30 and the fixing device 20 are held by a structural frame (a housing including a first frame 46, a second frame 47, and the like) of the drawer unit 45 (device). The drawer unit 45 may be pulled out from the body of the image forming apparatus 1 in a direction indicated by an arrow as illustrated in FIG. 2 (−X direction, which is the front side of the image forming apparatus 1), or moved in the opposite direction (+X direction, which is the rear side of the image forming apparatus 1). Such a configuration as described above facilitates maintenance of the secondary transfer belt device 30 and the fixing device 20 or an operation of removing a sheet jammed (jam processing) at the position of the secondary transfer belt device 30 or the fixing device 20.

In the present embodiment, the waste-toner collection container 90 is detachably attached to the image forming apparatus 1, independently from the operation of attaching and detaching the drawer unit 45 to and from the body of the image forming apparatus 1. Accordingly, the first waste-toner carrier pipe 71 and the second waste-toner carrier pipe 72 that includes a second connector 72a are attached to and detached from the waste-toner collection container 90 in conjunction with the attachment and detachment operation of the drawer unit 45 to and from the body of the image forming apparatus 1.

With reference to FIG. 3 and the like, in the present embodiment, the first waste-toner carrier pipe 71 and the second waste-toner carrier pipe 72 constitute a waste-toner carrier pipe (waste-toner conveyance path). The first waste-toner carrier pipe 71 and the second waste-toner carrier pipe 72 are connected with each other via a first connector 71a.

The conveyance screws 73 (see FIG. 4) are included in both the first waste-toner carrier pipe 71 and the second waste-toner carrier pipe 72. The conveyance screws 73 are rotationally driven to convey the waste toner in the first waste-toner carrier pipe 71 and the second waste-toner carrier pipe 72.

More specifically, the waste toner collected in the secondary transfer-belt cleaner 40 is conveyed in the direction indicated by white arrows (+X direction) in FIG. 3 in the first waste-toner carrier pipe 71, and moves to the second waste-toner carrier pipe 72 via the first connector 71a. Then, the waste toner is conveyed in a direction indicated by black arrows (substantially −Y direction) in FIG. 4 in the second waste-toner carrier pipe 72. After the conveyance direction is switched to the +X direction at a switching portion surrounded by a broken line in FIG. 4, the waste toner is conveyed and collected into the waste-toner collection container 90 via the second connector 72a.

In the present embodiment, the first waste-toner carrier pipe 71 and the second waste-toner carrier pipe 72 as objects to be cooled are disposed in a vicinity of the fixing device 20. The fixing device 20 is a heat source that heats an internal space of the image forming apparatus 1 (apparatus).

The fixing device 20 heats the fixing belt 21 to a high temperature by a heating device such as a heater to thermally melt a toner image on the sheet, and serves as a heat source to raise the temperature of the periphery of the fixing belt 21. As illustrated in FIGS. 1 and 2, the secondary transfer belt device 30 is disposed near the fixing device 20 (heat source). Accordingly, the temperature of the secondary transfer belt device 30 is easily increased by the heat. Toner has a property of being easily aggregated by heat. Accordingly, in a narrow space such as the space inside the first waste-toner carrier pipe 71 and the second waste-toner carrier pipe 72 (particularly, the second waste-toner carrier pipe 72), toner tends to be aggregated and fixed by heat.

Therefore, in the present embodiment, a ventilation path (ventilation duct 60 and a fan 61 as cooling devices) that actively cool the first waste-toner carrier pipe 71 and the second waste-toner carrier pipe 72 (particularly, the second waste-toner carrier pipe 72) are provided.

Figure 6:
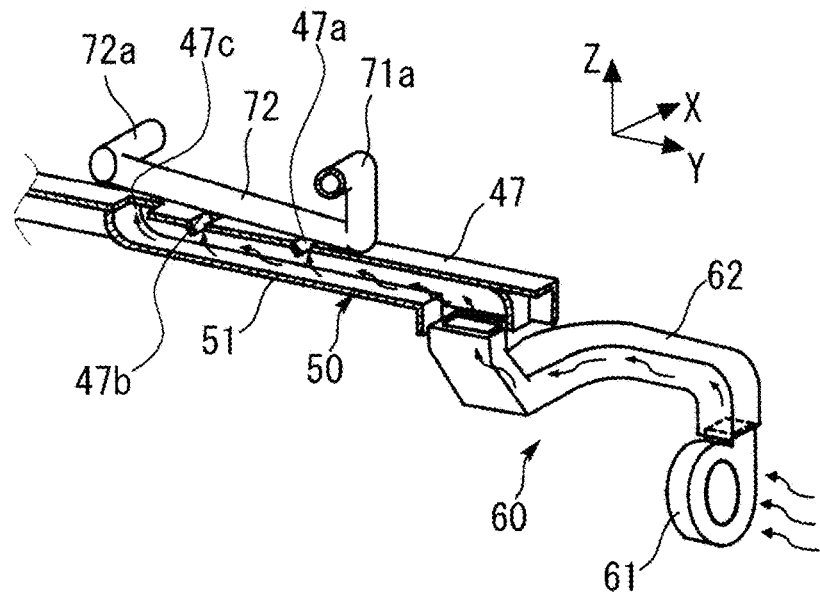
FIG. 6 is a schematic perspective view of a ventilation path in which a part of a duct of the ventilation path is viewed in cross section and a part of a waste-toner conveyance path, according to an embodiment of the present disclosure.

FIG. 6 is a schematic perspective view of a ventilation path in which a part of the first duct 50 and the ventilation duct 60 of the ventilation path is viewed in cross section and a part of the waste-toner conveyance path, according to the present embodiment. As illustrated in FIG. 6 and the like, in the present embodiment, the ventilation path (cooling devices) includes the ventilation duct 60, the fan 61, and the like.

The ventilation duct 60 guides the air sucked through an intake 83 communicating with the outside of the image forming apparatus 1 (apparatus) to exhaust ports 47*a*. 47*b*, and 47*c* that blow the air to the second waste-toner carrier pipe 72 (object to be cooled).

The ventilation duct 60 is formed by connecting a plurality of ducts (a first duct 50, a second duct 62, and a third duct 63).

More specifically, the three ducts (first duct 50, second duct 62, and third duct 63) form the ventilation duct 60 as a single duct. To be specific, the ventilation duct 60 is formed by connecting the third duct 63, the second duct 62, and the first duct 50 in this order from the intake 83 toward the exhaust ports 47*a*, 47*b*, and 47*c*. That is, the fan 61 is connected to an intake side of the third duct 63, an intake side of the second duct 62 is connected to an exhaust side of the third duct 63, and an intake side of the first duct 50 is connected to an exhaust side of the second duct 62.

Figure 9:
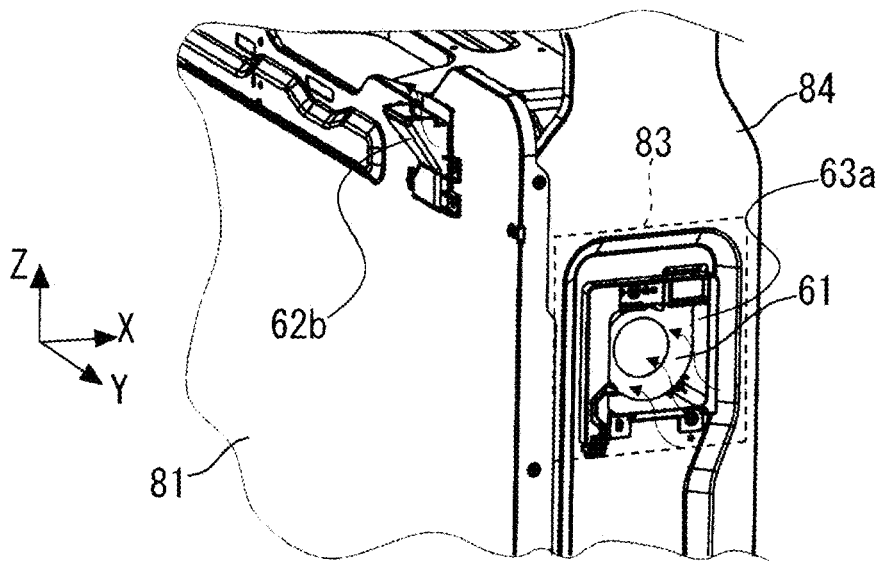
FIG. 9 is a perspective view of a fan viewed from outside of an image forming apparatus in a state in which an exterior cover of the image forming apparatus is removed, according to an embodiment of the present disclosure.
Figure 10:
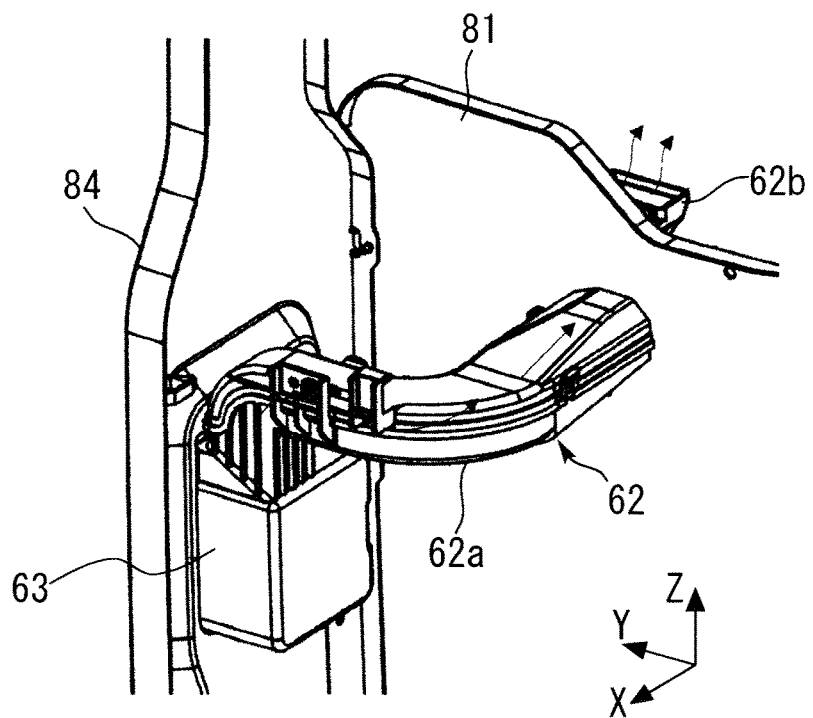
FIG. 10 is a perspective view of a second duct and a third duct of a ventilation path viewed from inside of an image forming apparatus, according to an embodiment of the present disclosure.
Figure 11:
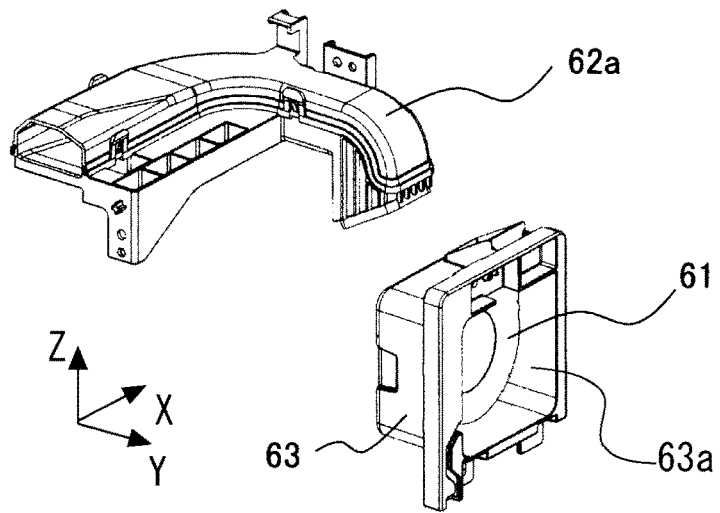
FIG. 11 is a perspective view of a state in which a second duct and a third duct provided with a fan are separated from each other, according to an embodiment of the present disclosure.
Figure 12:
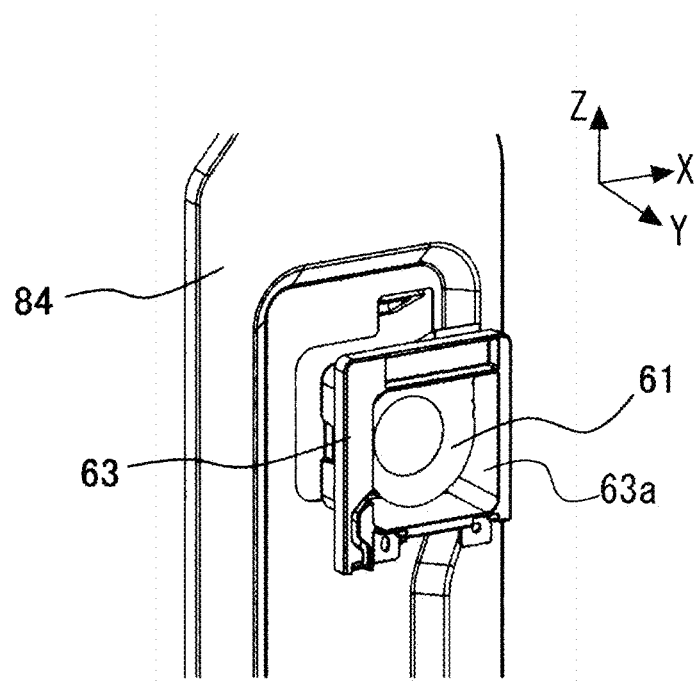
FIG. 12 is a perspective view of a third duct to which a fan is attached, which is detached from an image forming apparatus from which an exterior cover of the image forming apparatus is detached, according to an embodiment of the present disclosure.

FIG. 9 is a perspective view of a fan viewed from outside of the image forming apparatus 1 in a state in which an exterior cover of the image forming apparatus 1 is removed, according to the present embodiment. FIG. 10 is a perspective view of a second duct and a third duct of a ventilation path viewed from inside of the image forming apparatus 1, according to the present embodiment. FIG. 11 is a perspective view of a state in which a second duct and a third duct provided with a fan are separated from each other, according to the present embodiment. FIG. 12 is a perspective view of a third duct to which a fan is attached, which is detached from the image forming apparatus 1 from which its exterior cover is detached, according to the present embodiment. The fan 61 is an intake fan that sucks air into the first duct 50 and the second duct 62 and is fixed to the third duct 63 (see FIGS. 9, 10, 11, and 12) that also functions as a bracket. The third duct 63 is disposed at a position corresponding to the intake 83 of an exterior cover 82 in a main structural frame 84 (see FIGS. 9, 10, and 12) constituting the image forming apparatus 1. More specifically, the third duct 63 is fixed to the main structural frame 84 such that the intake 63*a* of the third duct 63 faces the intake 83 of the exterior cover 82.

Then, as indicated by arrows in FIG. 6, the air sucked from outside of the image forming apparatus 1 by the fan 61 is blown to the second waste-toner carrier pipe 72 from the exhaust ports 47*a*, 47*b*, and 47*c* via the third duct 63, the second duct 62, and the first duct 50. Accordingly, the second waste-toner carrier pipe 72 is cooled.

The first duct 50 is provided for the drawer unit 45 and is detachably attached to the body of the image forming apparatus 1. On the other hand, the second duct 62, the third duct 63, and the fan 61 are fixed to the body of the image forming apparatus 1. Accordingly, the first duct 50 is attached to and detached from (connected and disconnected) the second duct 62 in conjunction with the attachment and detachment operation of the drawer unit 45 to and from the body of the image forming apparatus 1.

With reference to FIG. 6 and the like, the image forming apparatus 1 (apparatus) according to the present embodiment, specifically, the drawer unit 45 includes the second waste-toner carrier pipe 72 (object to be cooled), the first duct 50 (one duct among the three ducts (first duct 50, second duct 62, and third duct 63) forming the ventilation duct 60) that forms a part of a ventilation path communicating with the outside of image forming apparatus 1 (apparatus).

Figure 7:
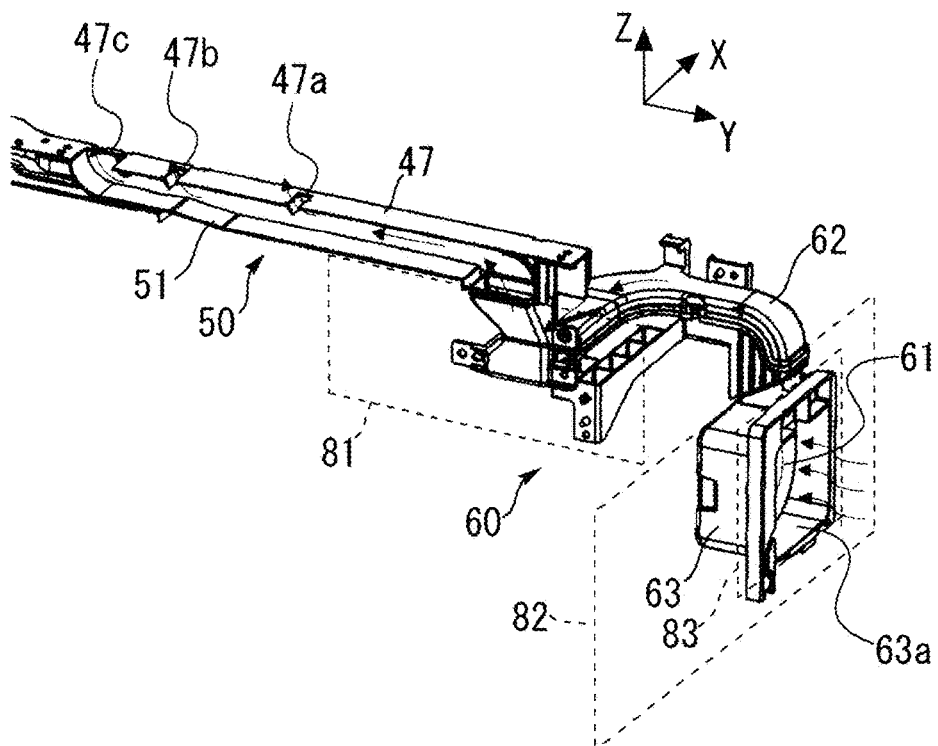
FIG. 7 is a perspective view of a ventilation path in which a part of a duct of the ventilation path is viewed in cross section, according to an embodiment of the present disclosure.
Figure 8:
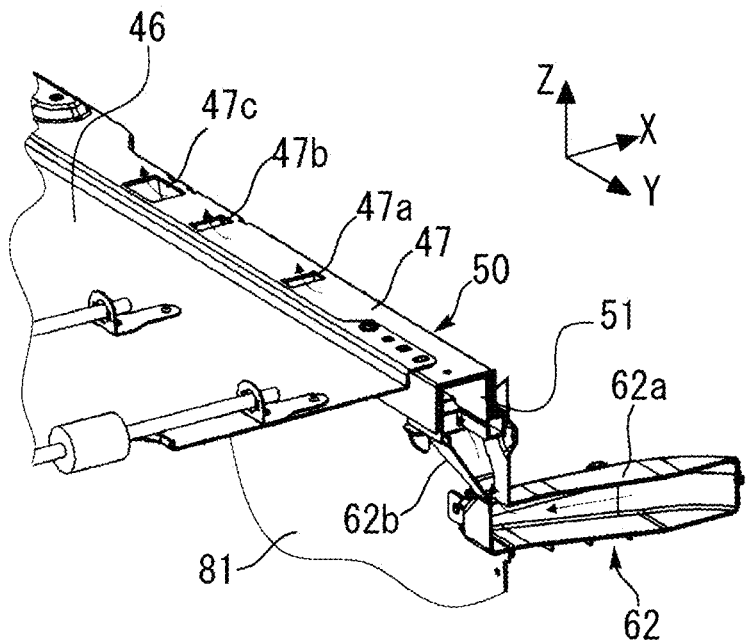
FIG. 8 is a perspective view of a ventilation path in which a part of a second duct of the ventilation path is viewed in cross section and a structural frame of a drawer unit, according to an embodiment of the present disclosure.

FIG. 7 is a perspective view of the ventilation path in which a part of the first duct 50, the second duct 62, and the third duct 63 of the ventilation path is viewed in cross section, according to the present embodiment. FIG. 8 is a perspective view of the ventilation path in which a part of the second duct 62 of the ventilation path is viewed in cross section and a structural frame of the drawer unit 45, according to the present embodiment. With reference to FIGS. 6, 7, 8 and the like, a part of the second frame 47 as a structural frame in the drawer unit 45 (device) is also employed as a part of the first duct 50. That is, the first duct 50 is not a member independent from the structural frame. However, a part of the structural frame is used as the first duct 50.

To be specific, the first duct 50 is a duct that also serves as a part of the structural frame. A portion of the second frame 47 (structural frame) having a substantially U-shaped cross section substantially orthogonal to a ventilation direction (direction in which air flows and substantially the −Y direction) is fitted with a dividing duct 51 as a fitted member having a substantially U-shaped cross section substantially orthogonal to the ventilation direction to form the first duct 50.

The second frame 47 is formed by bending (box bending) a sheet metal. On the other hand, the dividing duct 51 (fitted member) is formed of a resin material. The dividing duct 51 is fitted to the second frame 47 in a nested manner to prevent air leakage.

As described above, in the present embodiment, the first duct 50, the second duct 62, and the third duct 63 (ventilation path) that communicate with the second waste-toner carrier pipe 72 as an object to be cooled and the outside of the image forming apparatus 1 are provided to cool the second waste-toner carrier pipe 72. Accordingly, a disadvantage such that toner adhesion is caused by an increase of the temperature of the second waste-toner carrier pipe 72 can be restrained.

Further, in the present embodiment, all of the three ducts (the first duct 50, the second duct 62, and the third duct 63 that constitute the ventilation duct 60) are not provided independently. However, a part of the second frame 47 as the structural frame is also used as a part of the ventilation duct 60. Therefore, the image forming apparatus 1 can be reduced in size and a space to install the image forming apparatus 1 and the cost of the image forming apparatus 1 can be reduced.

In the present embodiment, in the first duct 50 in which a part of the second frame 47 (structural frame) is employed as a part of the first duct 50, the exhaust ports 47a, 47b, and 47c (exhaust ports of the ventilation duct 60) are formed. The exhaust ports 47a, 47b, and 47c open toward the second waste-toner carrier pipe 72 (object to be cooled) disposed on the second frame 47.

To be specific, in the present embodiment, a plurality of exhaust ports (three exhaust ports 47a, 47b, and 47c) are formed on the second frame 47 (structural frame) at positions spaced apart in a ventilation direction, and air is blown from each of the exhaust ports 47a, 47b, and 47c to cool the second waste-toner carrier pipe 72.

The exhaust ports 47a, 47b, and 47c are formed by cutting and bending the second frame 47. The cut and bent portions are located downstream from the ventilation direction with respect to the exhaust ports 47a, 47b, and 47c in the ventilation path. The cut and bent portions are formed so as to be inclined from upstream toward downstream in the ventilation direction toward the exhaust ports 47a, 47b, and 47c. Therefore, the air flowing in the first duct 50 is smoothly discharged from the exhaust ports 47a, 47b, and 47c toward the objects to be cooled via the cut and bent portions.

In the present embodiment, at least one of the exhaust ports 47a, 47b, and 47c, in particular, the exhaust port 47c, has an opening that is larger than the opening of each one of the other exhaust ports 47a and 47b. The at least one exhaust port (in particular, the exhaust port 47c) is opened so that air is blown toward a portion of the second waste-toner carrier pipe 72. The portion of the second waste-toner carrier pipe 72 corresponds to an end of the conveyance screw 73 (conveyance member) or a switching portion (the portion surrounded by the broken line in FIG. 4) at which a conveyance direction of the second waste-toner carrier pipe 72 (powder carrier pipe) is switched.

More specifically, among the three exhaust ports 47a, 47b, and 47c, the opening area of the exhaust port 47c located on a most downstream side in the ventilation direction is larger than the opening area of each one of the exhaust port 47a and the exhaust port 47b. Thus, a large amount of air can be exhausted to improve cooling efficiency. On the other hand, at the end of the conveyance screw 73 and the switching portion of the second waste-toner carrier pipe 72, the waste toner is more likely to stay and the toner is more likely to be fixed than in other portions of the second waste-toner carrier pipe 72. For this reason, the exhaust port 47c is opened toward the portion at which the waste toner is likely to stay and be fixed to intensively cool the portion and increase the cooling efficiency.

As described above, in the present embodiment, the ventilation duct 60 according to an embodiment of the present disclosure includes the second duct 62 that guides the air sucked from outside of the image forming apparatus 1 (apparatus) to the first duct 50 (duct).

In the present embodiment, as illustrated in FIGS. 9 and 10, the main structural frame 84 and a second side plate 81 that function as structural frames of the image forming apparatus 1 are provided. The second side plate 81 is disposed at a position at which the second duct 62 straddles the second side plate 81. Therefore, in the present embodiment, the second duct 62 is further divided into two connection ducts 62a and 62b. The connection duct 62a (see FIGS. 10 and 11) disposed on one surface of the second side plate 81 and the connection duct 62b (see FIGS. 8, 9, and 10) disposed on the other surface of the second side plate 81 are connected at the position of the second side plate 81. With this configuration, the second duct 62 can be arranged in a free layout without being affected by the second side plate 81.

Figure 5:
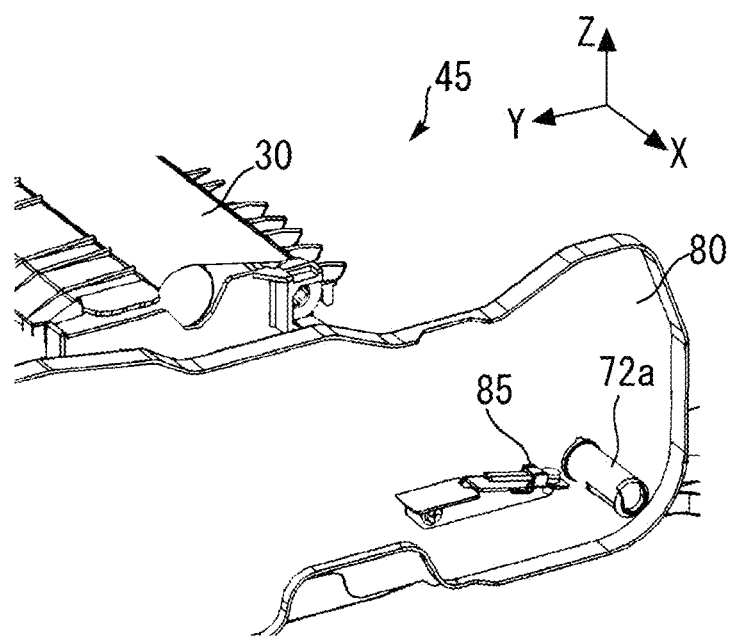
FIG. 5 is a perspective view of the waste-toner conveyance path and the drawer unit of FIG. 4, illustrating the relative positions of the waste-toner conveyance path and a side plate of the drawer unit.

FIG. 5 is a perspective view of the waste-toner conveyance path and the drawer unit 45 of FIG. 4, illustrating the relative positions of the waste-toner conveyance path and a side plate of the drawer unit 45. As illustrated in FIGS. 3 and 5, the image forming apparatus 1 (apparatus) according to an embodiment of the present disclosure includes a temperature sensor 85 as a temperature detector that detects the internal temperature of the image forming apparatus 1. The temperature sensor 85 is provided in a vicinity of the second waste-toner carrier pipe 72 (object to be cooled) and at a position isolated by a first side plate 80 (a side plate constituting the drawer unit 45) as a partition from the exhaust ports 47a, 47b, and 47c of the first duct 50.

When the temperature detected by the temperature sensor 85 (temperature detector) exceeds a predetermined value T (for example, about 30° C.), the fan 61 is controlled to be driven.

More specifically, when the temperature detected by the temperature sensor 85 does not reach the predetermined value T, it is determined that there is no possibility of toner adhesion in the second waste-toner carrier pipe 72, and the fan 61 is not driven to cool the second waste-toner carrier pipe 72. On the other hand, when the temperature detected by the temperature sensor 85 reaches the predetermined value T, the fan 61 is driven to cool the second waste-toner carrier pipe 72 on an assumption that the toner may adhere to the second waste-toner carrier pipe 72.

Performing such a control allows the second waste-toner carrier pipe 72 to be efficiently cooled without wastefully driving the fan 61.

In addition, since the temperature sensor 85 (temperature detector) is disposed in the vicinity of the second waste-toner carrier pipe 72 and at the position isolated from the exhaust ports 47a, 47b, and 47c by the first side plate 80 (partition), the ambient temperature of the second waste-toner carrier pipe 72 can be accurately detected without being cooled by the air exhausted from the exhaust ports 47a, 47b, and 47c. Therefore, the above-described effect (the effect of efficiently cooling the second waste-toner carrier pipe 72) is likely to be achieved.

As described above, the image forming apparatus 1 according to the embodiments of the present disclosure includes the second waste-toner carrier pipe 72 (object to be cooled), the second frame 47 (structural frame) of the drawer unit 45 (or the image forming apparatus 1), and the ventilation duct 60. The second waste-toner carrier pipe 72 is disposed inside the image forming apparatus 1. The second frame 47 is detachably attached to the image forming apparatus 1. The ventilation duct 60 guides the air sucked from the intake 83 communicating with the outside of the image forming apparatus 1 to the exhaust ports 47a, 47b, and 47c that blow the air to the second waste-toner carrier pipe 72. The ventilation duct 60 is formed by connecting a plurality of ducts (i.e., first duct 50, second duct 62, and third duct 63). Apart of the second frame 47 is also used as apart of the first duct 50 (at least one duct) of the plurality of ducts (first duct 50, second duct 62, and third duct 63).

Thus, the second waste-toner carrier pipe 72 can be cooled without increasing the size of the image forming apparatus 1.

In the embodiments of the present disclosure, the first waste-toner carrier pipe 71 and the second waste-toner carrier pipe 72 (powder carrier pipes) as the objects to be cooled are used to convey the waste toner collected by the secondary transfer-belt cleaner 40. However, a powder carrier pipe as an object to be cooled is not limited to convey waste toner. Such a powder carrier pipe may also be used to convey the waste toner collected by the cleaning devices for the photoconductor drums 11, the intermediate transfer belt cleaner 19, or a plurality of these cleaning devices. Further, the object to be cooled is not limited to a powder carrier pipe. The object to be cooled may be, for example, a toner container, a developing device, a process cartridge, or the like in which toner is accommodated, a motor such as a polygon motor, or an electronic component such as an electronic substrate.

Although in the embodiments according to the present disclosure are applied to the image forming apparatus 1, the embodiments according to the present disclosure can also be applied to an apparatus other than an image forming apparatus as long as an object to be cooled is installed inside the apparatus.

In such configurations, effects similar to those of the above-described embodiments can also be obtained.

Further, in the embodiments of the present disclosure, a part of the second frame 47 (structural frame) in the drawer unit 45 (unit) detachably installed in the image forming apparatus 1 is also used as a part of the first duct 50. The first duct 50 is at least one of the plurality of ducts (first duct 50, second duct 62, and third duct 63 constituting the ventilation duct 60). On the other hand, a part of the structural frame of the image forming apparatus 1 may also be used as a part of the duct (at least one duct among the multiple ducts).

Further, in the embodiments of the present disclosure, only one duct (first duct 50) among the three ducts (first duct 50, second duct 62, and third duct 63) constituting the ventilation duct 60 serves as a part of the structural frame. However, two or more ducts may serve as a part of the structural frame.

In such configurations, effects similar to those of the above-described embodiments can also be obtained.

The present disclosure is not limited to the above-described embodiments, and the configuration of the present embodiments can be appropriately modified other than suggested in each of the above-described embodiments within a scope of the technological concept of the present disclosure. Further, the number, position, and shape of the components described above are not limited to the embodiments described above, and desirable numbers, positions, and shapes can be determined as required to practice the present disclosure.

In addition, in the specification and the like of the present disclosure, "removal" of "removable" is defined to represent not only a state of being completely removed from the image forming apparatus 1. However, "removal" also represents a state of being pulled out from the image forming apparatus 1 in a case of the drawer unit 45 illustrated in the embodiments.

In the above descriptions, the term "printing" in the present disclosure may be used synonymously with, e.g. the terms of "image formation" "recording", "printing", and "image printing". Further, the coater according to an embodiment of the present disclosure can also be applied to an apparatus that performs printing on an electrophotographic process on a sheet material coated with a coating liquid.

The suffixes Y, M, C, and K attached to each reference numeral indicate only that components indicated thereby are used for forming yellow, magenta, cyan, and black images, respectively, and hereinafter may be omitted when color discrimination is not necessary.

The above-described embodiments are illustrative and do not limit the present invention. Thus, numerous additional modifications and variations are possible in light of the above teachings. For example, elements and/or features of different illustrative embodiments may be combined with each other and/or substituted for each other within the scope of the present disclosure.

What is claimed is:

1. An apparatus comprising:
a body; an object to be cooled;
a unit configured to detach from the body of the apparatus;
a structural frame constituting a part of the body or the unit; and
a ventilation duct including a plurality of ducts connected to each other, the ventilation duct being configured to guide air sucked from outside of the body through an intake of the body to an exhaust port to blow the air to the object to be cooled, the structural frame having a part used as a part of at least one of the plurality of ducts, an intake of the ventilation duct facing the intake of the body, the structural frame includes the exhaust port on a surface of the structural frame; and
wherein the part of the structural frame is nested into at least one of the plurality of ducts.

2. The apparatus according to claim 1,
wherein the at least one of the plurality of ducts includes a fitted member having a substantially U-shaped cross section substantially orthogonal to a ventilation direction of the air, and
wherein the part of the structural frame having a substantially U-shaped cross section substantially orthogonal to a ventilation direction is fitted to the fitted member to form the at least one of the plurality of ducts.

3. The apparatus according to claim 1,
wherein the object to be cooled is provided on the structural frame.

4. The apparatus according to claim 1,
wherein the at least one of the plurality of ducts includes the exhaust port being open toward the object to be cooled.

5. The apparatus according to claim 1,
wherein the exhaust port includes a plurality of exhaust ports at positions spaced apart from each other in a ventilation direction of the air, and
wherein an opening area of at least one of the plurality of exhaust ports is larger than an opening area of another one of the plurality of exhaust ports.

6. The apparatus according to claim 5,
wherein the object to be cooled is a powder carrier pipe including a conveyance member configured to convey powder, and
wherein the at least one of the plurality of exhaust ports is open toward a portion of the powder carrier pipe corresponding to an end of the conveyance member or a switching portion at which a conveyance direction of the powder carrier pipe is switched.

7. The apparatus according to claim 1, further comprising a fan configured to suck air into the ventilation duct.

8. The apparatus according to claim 7, further comprising:
a temperature detector at a position near the object to be cooled, the temperature detector being configured to detect an internal temperature of the apparatus; and
a partition isolating the temperature detector from the exhaust port,
wherein the fan is configured to be driven when a temperature detected by the temperature detector exceeds a predetermined value.

9. The apparatus according to claim 1, further comprising a heat source configured to raise a temperature inside the apparatus,
   wherein the object to be cooled is disposed in a vicinity of the heat source.

10. An image forming apparatus comprising:
   the apparatus according to claim 1; and
   an image forming device.

11. The apparatus according to claim 7, further comprising an airflow path, the airflow path extending from the intake of the body, through the intake of the vent, through the fan, through the plurality of ducts, and through the part of the structural frame to the exhaust port.

12. The apparatus according to claim 1, wherein the exhaust port is integral to the surface of the structure frame.

13. An apparatus comprising:
   a body;
   an object to be cooled;
   a unit configured to detach from the body of the apparatus;
   a structural frame constituting a part of the body or the unit; and
   a ventilation duct including a plurality of ducts connected to each other, the ventilation duct being configured to guide air sucked from outside of the body through an intake of the body to an exhaust port to blow the air to the object to be cooled, the structural frame having a part used as a part of at least one of the plurality of ducts,
   wherein the at least one of the plurality of ducts includes a fitted member having a substantially U-shaped cross section substantially orthogonal to a ventilation direction of the air, and
   wherein the part of the structural frame having a substantially U-shaped cross section substantially orthogonal to the ventilation direction is fitted to the fitted member to form the at least one of the plurality of ducts.

14. An apparatus comprising:
   a body;
   an object to be cooled;
   a unit configured to detach from the body of the apparatus;
   a structural frame constituting a part of the body or the unit;
   a ventilation duct including a plurality of ducts connected to each other, the ventilation duct being configured to guide air sucked from outside of the body through an intake of the body to an exhaust port to blow the air to the object to be cooled, the structural frame having a part used as a part of at least one of the plurality of ducts;
   a fan configured to suck air into the ventilation duct;
   a temperature detector at a position near the object to be cooled, the temperature detector being configured to detect an internal temperature of the apparatus; and
   a partition isolating the temperature detector from the exhaust port,
   wherein the fan is configured to be driven when a temperature detected by the temperature detector exceeds a predetermined value.

* * * * *